US008156457B2

(12) United States Patent
Basile et al.

(10) Patent No.: US 8,156,457 B2
(45) Date of Patent: Apr. 10, 2012

(54) CONCURRENT SIMULATION OF HARDWARE DESIGNS WITH BEHAVIORAL CHARACTERISTICS

(75) Inventors: Claudio Basile, Oakland, CA (US); Giacinto Paolo Saggese, San Jose, CA (US); Keith Whisnant, San Diego, CA (US)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 12/586,724

(22) Filed: Sep. 24, 2009

(65) Prior Publication Data
US 2011/0072403 A1 Mar. 24, 2011

(51) Int. Cl.
*G06F 17/50* (2006.01)

(52) U.S. Cl. .......... 716/106; 716/103; 716/104; 703/14; 717/144

(58) Field of Classification Search .......... 716/103–104, 716/106; 703/14; 717/144
See application file for complete search history.

(56) References Cited

U.S. PATENT DOCUMENTS

| | | | |
|---|---|---|---|
| 5,502,661 A * | 3/1996 | Glunz | 703/14 |
| 5,544,066 A | 8/1996 | Rostoker et al. | |
| 5,752,000 A | 5/1998 | McGeer et al. | |
| 6,021,266 A * | 2/2000 | Kay | 716/103 |
| 6,138,266 A | 10/2000 | Ganesan et al. | |
| 6,430,732 B1 | 8/2002 | Hwang et al. | |
| 6,539,520 B1 | 3/2003 | Hao et al. | |
| 6,694,505 B1 * | 2/2004 | Tan | 717/100 |
| 7,000,213 B2 * | 2/2006 | Banerjee et al. | 716/103 |
| 7,003,746 B2 | 2/2006 | Hyduke et al. | |
| 7,080,365 B2 * | 7/2006 | Broughton et al. | 717/146 |
| 7,194,724 B2 * | 3/2007 | Hattori et al. | 716/104 |
| 7,257,802 B2 * | 8/2007 | Daw et al. | 716/104 |
| 7,480,610 B2 * | 1/2009 | Scott et al. | 703/23 |
| 7,890,903 B2 * | 2/2011 | Weber et al. | 716/106 |
| 2004/0088691 A1 | 5/2004 | Hammes et al. | |
| 2005/0055675 A1 * | 3/2005 | Neifert et al. | 717/135 |
| 2005/0125762 A1 * | 6/2005 | Hattori et al. | 716/18 |
| 2006/0156260 A1 * | 7/2006 | Ciesielski et al. | 716/3 |
| 2007/0169039 A1 * | 7/2007 | Lin | 717/146 |
| 2008/0059621 A1 * | 3/2008 | Raghavan et al. | 709/223 |
| 2008/0208559 A1 * | 8/2008 | Koelbl et al. | 703/16 |
| 2010/0218149 A1 * | 8/2010 | Sasaki | 716/5 |

FOREIGN PATENT DOCUMENTS
WO 00/22553 A2 4/2000

OTHER PUBLICATIONS

Schliebusch et al. "A framework for automated and optimized ASIP implementation supporting multiple hardware description languages", Proc. of the 2005 Asia and South Pacific Design Automation Conference, 2005 ACM, pp. 280-285.
Vassiliadis et al. The MOLEN polymorphic processor, IEEE Trans. on Computers, vol. 53, No. 11, Nov. 2004, pp. 1363-1375.

(Continued)

*Primary Examiner* — Naum Levin
(74) *Attorney, Agent, or Firm* — Bever, Hoffman & Harms, LLP; Jeanette S. Harms

(57) ABSTRACT

Simulating hardware includes generating a data flow representation of the hardware, based on a hardware description language (HDL) description. The data flow representation including compatibility information that preserves behavioral and synthesizable characteristics of the HDL description. Simulating hardware further includes generating code from the data flow representation, and executing the code concurrently.

26 Claims, 13 Drawing Sheets

OTHER PUBLICATIONS

Choi et al., "Comparisons and Analysis of Massively Parallel SIMD Architectures for Parallel Logic Simulation," IEEE Parallel Processing Symposium, 1992, pp. 671-674.

Barzilai et al., "HSS—A High-Speed Simulator", IEEE Transactions on Computer-Aided Design, Jul. 1987, vol. CAD-6, No. 4, pp. 601-617.

Mentor Graphic Corporation, "ModelSim User's Manual", Software Version 6.3g, May 2008, pp. 139-217.

Synopsys, "VCS/VCSi User Guide", Version 7.0.1, Apr. 2003, p. 4-1 & 4-24.

Cadence, "Affirma NC Verilog Simulator Help", Product Version 3.1, Jun. 2000, pp. 254-290.

Quickturn, "SpeedSim Documentation—User Guide", Version 3.5.7, 2003, pp. 1-1-13-1.

* cited by examiner

CONCURRENT SIMULATION OF HARDWARE DESIGNS WITH BEHAVIORAL CHARACTERISTICS

BACKGROUND OF THE INVENTION

Logic simulation is an essential step in the design flow of electronic circuits. Logic simulation is usually performed with Electronic Design Automation (EDA) software tools referred to as logic simulators, which process hardware designs typically provided in the form of Hardware Description Language (HDL) code. Hardware designers perform extensive logic simulations to verify that a hardware design complies with its specifications, before committing the hardware design to the physical implementation phase that produces the actual electronic circuit. In a typical hardware design flow, a functional verification process is carried out along with the design process in order to minimize the risk of producing a circuit that is not compliant with its specifications. A logic simulation typically generates as its results the waveforms of a set of circuit signals the user is interested in observing. The user can analyze and visualize the generated waveforms to verify that the hardware design operates correctly. Logic simulators also support simulating hardware designs with embedded assertions, which use the values of the circuit signals to detect conditions resulting in circuit malfunctioning. A logic simulator evaluates such assertions while simulating the circuit, and reports their violations to the user. Based on these violation reports, the user can uncover and fix design errors in the hardware design.

The result of insufficient or inaccurate verification of an electronic circuit can be an implemented circuit not compliant with its specifications, which can lead to customer dissatisfaction, revenue loss, increased time-to-market, and additional design and manufacturing effort. In a modern verification process a hardware description is typically verified against its specifications by testing its behavior with a large set of tests. Each test generates a set of circuit stimuli, which are used as inputs to the circuit design. A verification process can include as many as several hundred thousands of tests. New tests are added as new features are introduced in the circuit design while existing tests may be randomized to provide variation in the generated stimuli each time they are executed. A verification process is typically executed both periodically (e.g., nightly) and before finalizing recent changes made to the circuit design.

Functional verification is a major contributor to a circuit design's time to market. The amount of time required for functional verification may account for up to 70% of the design time. Most functional verification is performed using logic simulation. The exponential increase in complexity of electronic circuit designs exposes the limitations of state-of-the-art logic simulators. The common practice of increasing the computing power of simulation workstations is inadequate to keep up with the exponentially increased gate count of modern circuit designs. Shorter design turn-around and increased circuit complexity require great acceleration in the operations of logic simulators. Existing solutions, however, are usually very inefficient in situations where multiple simulations are required for a circuit.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term "processor" refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A software-based technique to efficiently perform concurrent simulations of a hardware design is described. In some embodiments, the simulation software processes a description of the hardware encoded as a Hardware Description Language (HDL) program, and generates a data flow representation that preserves behavioral characteristics of the hardware design. The data flow representation is transformed into code such as instructions that can be executed on a processor. In some embodiments, the instructions are bitwise instructions that perform a given operation on the individual bits of the operand words. In some embodiments, the instructions are parallel instructions that perform a given operation on multiple operand words and can be executed on a parallel processor such as a processor that supports Single Instruction Multiple Data (SIMD) instructions.

Figure 1:
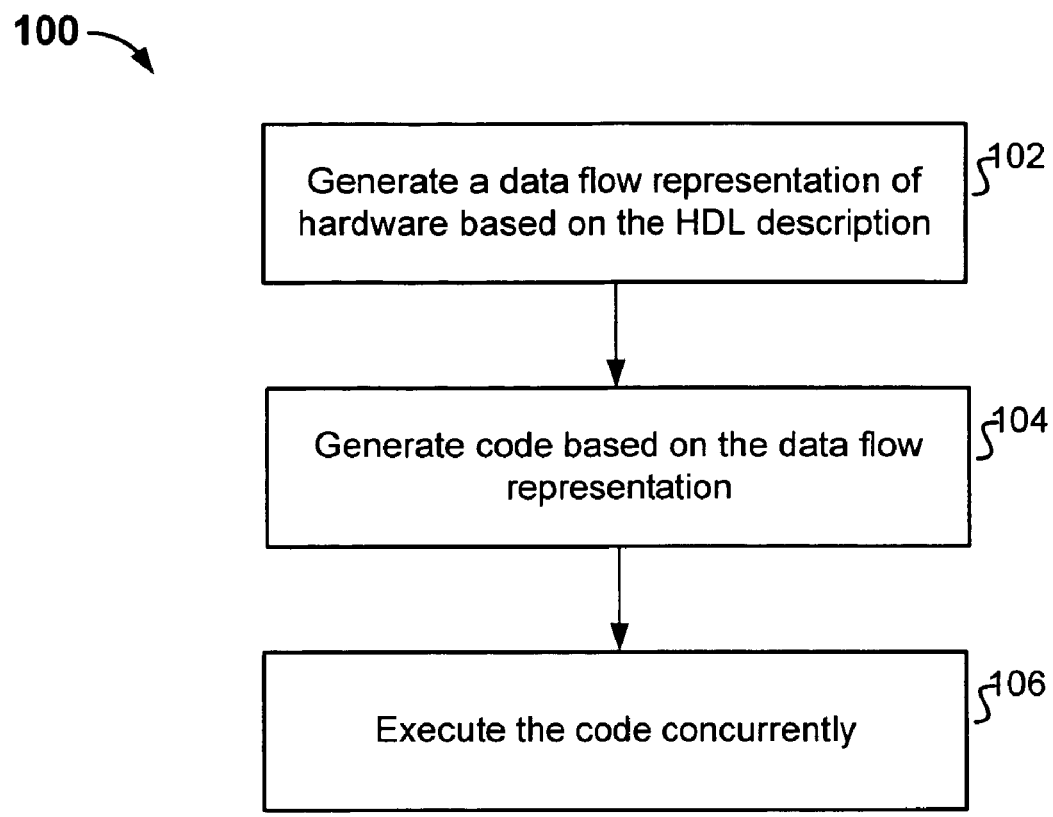
FIG. 1 is a flowchart illustrating an embodiment of a process for simulating hardware concurrently.

FIG. 1 is a flowchart illustrating an embodiment of a process for simulating hardware concurrently. Process 100 may be performed on a system such as system 200 described below. It is assumed that a HDL description of hardware such as a logic circuitry is already available at the time the process initiates. In some embodiments, the logic circuitry is described using an HDL such as Verilog, System Verilog, VHDL, or any other appropriate programming language. The hardware description includes both behavioral and synthesizable characteristics of the hardware. As used herein, synthesizable characteristics of the hardware refer to constructs in the hardware description that can be translated into a physical hardware, such as gate and wire placement. Behavioral characteristics of the hardware refer to constructs in the hardware description that are not directly translated into physical hardware, e.g., multi-level signal values (such as 'X' or 'Z' logic values, logic values with strength, etc.), loops with terminating conditions not determinable at compile time, console or file I/O operations (e.g., $display statements), Program Language Interface (PLI) calls to communicate with third-party software components external to the simulator software, etc.

At 102, a data flow representation of the hardware is generated based on the HDL description. As used herein, the data flow representation refers to a representation of the hardware that describes the flow of the data through various components of the hardware. In this example, the data-flow representation resembles a netlist representation of the hardware. As will be described in greater detail below, the data flow representation includes compatibility information (for example special compatibility operators) that preserve behavioral characteristics of the HDL description typically lost in other existing techniques for modeling a hardware design with a netlist representation during the process of synthesizing the hardware design onto physical hardware. One type of behavioral characteristic preserved in the data flow representation is the type of the HDL variables in the hardware description, which in general are multi-valued, i.e., they can take one of a variety of possible values (e.g., 0, 1, X, Z).

At 104, code is generated from the data flow representation. The generated code includes processor instructions that can be executed on a processor. The code generation is described in greater detail below. In some embodiments, the data flow representation is converted into a Boolean representation that uses Boolean (binary) variables, i.e., variables with values of 0 or 1, and the Boolean representation is further processed to generate the desired code.

At 106, the code is executed concurrently on a processor. In other words, a single instance of the code is executed on the processor to simultaneously perform multiple simulations. In various embodiments, hardware simulations under multiple operating scenarios, hardware simulations under multiple test conditions, hardware simulations on duplicated modules, or a combination thereof can be simultaneously performed on a processor. Many types of generated code are possible in various embodiments. In some embodiments, the generated code includes x86 instructions and is executed on a processor such as the Intel Pentium™ processor. In some embodiments, the generated code includes instructions that allow parallel execution, and the code is concurrently executed. For example, in some embodiments, Single Instruction Multiple Data (SIMD) instructions are generated and executed on a parallel processor that supports SIMD instruction set, such as various general processors by Intel, AMD and IBM that include Streaming SIMD Extensions (SSE), certain Very Long Instruction Word (VLIW) processors such as the Intel Itanium™, certain Digital Signal Processors (DSPs) and Graphical Processing Units (GPUs). Since SIMD allows multiple sets of data to be processed using a single instruction (for example, 128 sets of values can be processed in a single operation), multiple simulations can be executed in parallel, and efficiency is greatly increased.

Figure 2:
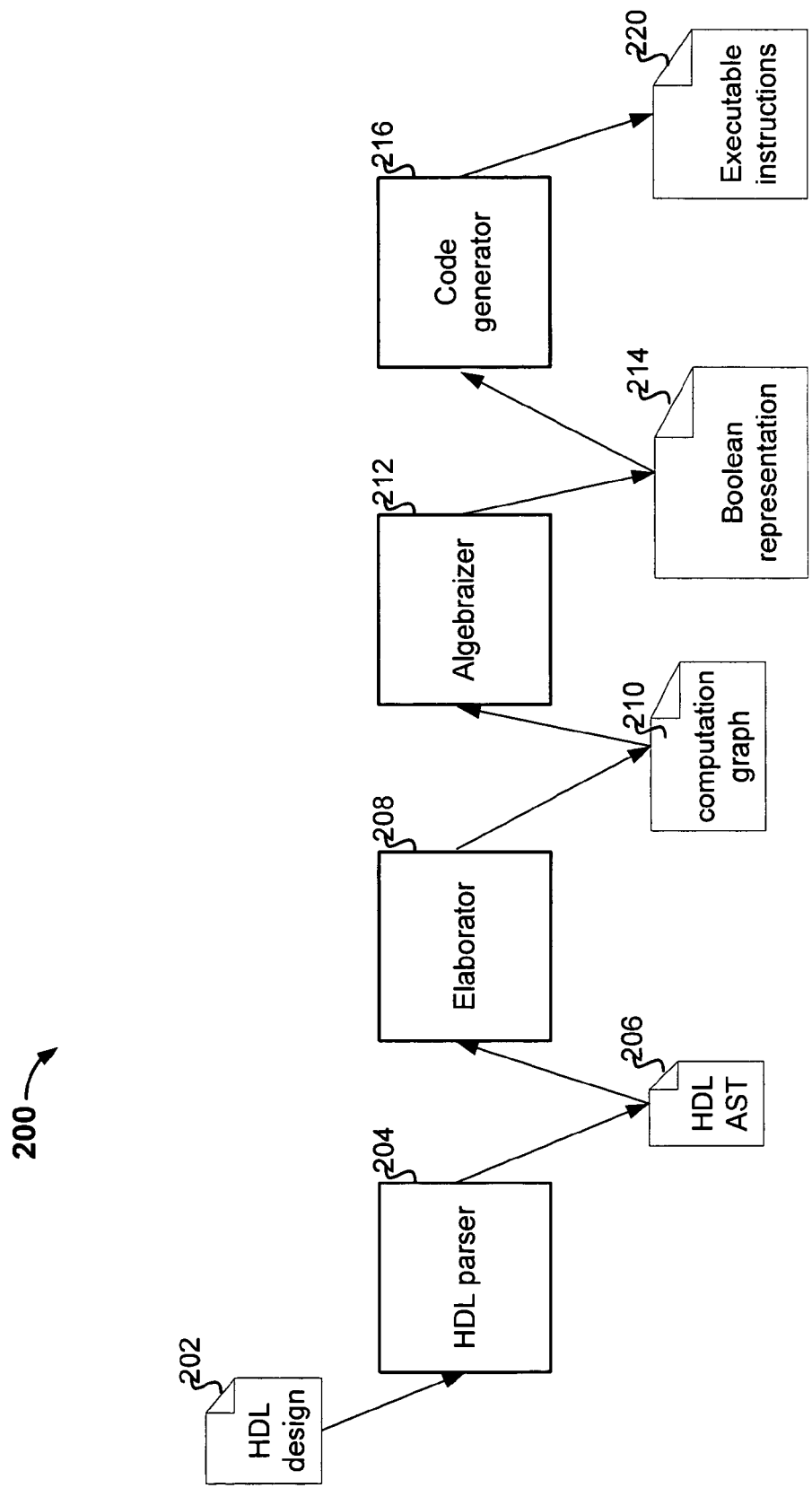
FIG. 2 is a block diagram illustrating an example implementation of a concurrent simulation system.

FIG. 2 is a block diagram illustrating an example implementation of a concurrent simulation system. System 200 implements process 100. The system includes a HDL parser 204, an elaborator 208, an algebraizer 212, and a code generator 216. A circuit designer or an automated process creates an HDL description of certain hardware and its associated signals as an HDL design file 202. The HDL file includes behavioral and synthesizable characteristics of the hardware. The HDL file is parsed by parser 204, which generates an HDL Abstract Syntax Tree (AST) representation 206. The AST is sent to elaborator 208, which generates a data flow representation of the hardware based on the AST representation. In this example, the data flow representation includes a computation graph. Unlike a traditional netlist that includes gate level components and their interconnections but does not include behavioral information, the computation graph shown is a high level representation that employs special compatibility operators to preserve behavioral characteristics of the HDL code. The operation of the elaborator will be shown in various examples below. In some embodiments, the elaborator works on the basis of modules. The following pseudocode illustrates an embodiment of an elaborator process:

```
Elaborate(HdlModule m) {
    create a new computation graph G
    foreach port p in m {
        create port variable p in G
    }
    foreach internal variable v in m {
        create internal variable v in G
    }
    foreach concurrent statement s in m {
        elaborate s by creating appropriate operators and variables in G
    }
}
```

As will be discussed in greater detail below, variables in the hardware description and in the computation graph may be multi-valued. In other words, each variable can be one of a number of possible logic values (e.g., 0, 1, X, Z). Algebraizer 212 processes the computation graph and encodes it into a Boolean representation 214. The Boolean representation is further processed by code generator 216 to generate executable simulation instructions 220.

The modules described above can be implemented as software components executing on one or more processors. In some embodiments, the modules can be embodied by a form of software products which can be stored in a nonvolatile storage medium (such as optical disk, flash storage device, mobile hard disk, etc.), including a number of instructions for making a computer device (such as personal computers, servers, handheld devices, etc.) implement the methods described in the embodiments of the present invention. The modules may be implemented on a single device or distributed across multiple devices. The functions of the modules may be merged into one another or further split into multiple submodules.

In various embodiments, the computation graph (and in some cases also the Boolean representation) includes compatibility operators and variables, and their associated attributes to properly preserve behavioral characteristics in the HDL description. For example, certain operators and variables are used to preserve control flow information (i.e., while loops), examples include spike operators and associated event variables for the sensitivity list of loop body operators; certain operators are used to preserve timing and hardware description of scheduling semantic information, examples include #delay, posedge, negedge, precedence operators; certain operators are used to model hardware description of system calls, examples include $display for I/O operations, $time for returning the current simulation time, and many other types of hardware description of system calls; certain operators are used to model interactions with external software modules, examples include Program Language Interface (PLI) calls. Attributes of variables or operators are also used to preserve behavioral information. For example, information pertaining to HDL variable type is preserved using variable attributes indicating the multi-level logic values and strength levels that a variable can take; information pertaining to HDL assignment type is preserved using assignment attributes such as blocking, non-blocking, and continuous. These compatibility operators, variables, attributes, and the behaviors modeled by the operators, variables, and attributes are discussed in detail below.

FIGS. 3-8 are computation graphs illustrating these operators, variables, and their associated attributes. In the following examples, the computation graphs include variables (represented as circles) and operators (represented as parallelograms). Both variables and operators have attributes. Variable attributes convey information affecting how variables are allocated at the beginning of the simulation and how they are updated during the simulation. Variable attributes include: name, type, size (e.g., number of bits), value at simulation startup time, etc. Operator attributes convey information affecting how the operators are expected to execute during the simulation. Operator attributes include: type, assignment type (e.g., continuous, blocking, nonblocking), sensitivity list, optional precedence arcs, optional special attributes, etc.

In the following examples that are based on the Verilog hardware description language, operators are scheduled for evaluation under the following conditions: a) operators modeling Verilog continuous assignments (denoted as type CNT in the diagrams below) do not have a sensitivity list and are scheduled for evaluation when any of their inputs change; b) operators modeling Verilog blocking assignments (denoted as type BA in the diagrams) or Verilog nonblocking assignments (denoted as type NBA in the diagrams) always have a sensitivity list and are scheduled for evaluation when any of the variables in their sensitivity list change. As used herein, a sensitivity list refers to a list of variables and is used to capture transitions in the values of the variables in the sensitivity list. Event variables are exceptions since when they are used in a sensitivity list only 0-to-1 transitions are considered for them (i.e., their 1-to-0 transitions are ignored). The evaluation semantics are similar for other hardware description languages such as SystemVerilog and VHDL.

Once operators are scheduled for evaluation, their evaluation order follows the data dependencies shown in the graph (shown as solid arrows in the diagrams). In other words, the operators are evaluated after their inputs have been evaluated. Precedence arcs (shown as a dashed arrow in the diagrams below) are sometimes introduced to establish an evaluation order that takes precedence over the data-dependence order. When operators are evaluated, the result of their computation is assigned to the variables connected to their outputs.

Figure 3:
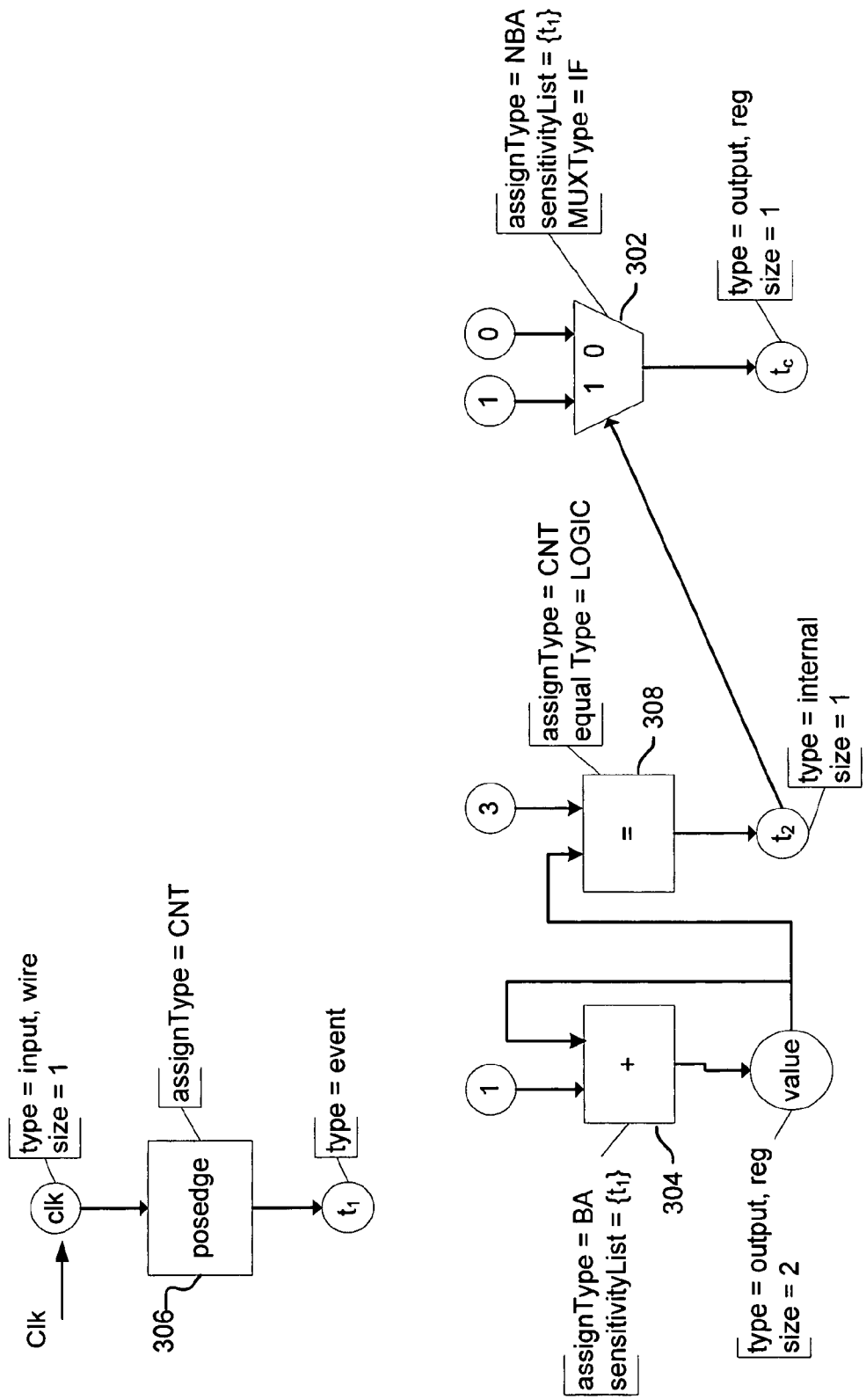
FIG. 3 is a computation graph illustrating a 2-bit counter module example.

FIG. 3 is a computation graph illustrating a 2-bit counter module example. The module is described in Verilog as follows:

```
module ex1 (value, clk, tc);
   input wire   clk;
   output reg [1:0] value = 0;
   output reg   tc = 0;
   always @(posedge clk)
   begin
      value = value + 1;
      if (value = = 3)
         tc <= 1;
      else
         tc <= 0;
   end
endmodule
```

The computation graph of FIG. 3 illustrates several behavioral attributes for variables and operators. Attributes are shown next to their respective operators or variables.

The "if" statement in Verilog example module ex1 is represented as a multiplexer (MUX) 302 that has a "MUX type" attribute of "IF" to distinguish it from multiplexer operators generated from Verilog ternary operators, which have the form of "o=c?a:b" and would result in a "MUX type" attribute with the value of "TRN".

The "posedge" Verilog statement, although does not have a corresponding physical device, is represented using a positive edge (posedge) operator 306, which captures the following transitions of signal clk as required by the Verilog standard: '0' to '1', '0' to 'X', '0' to 'Z', 'X' to '1', and 'Z' to '1'.

Most operators in the computation graph represent typed assignments. In some embodiments, operators that generate intermediate values are modeled as continuous assignments (assign type=CNT) while operators assigning user-declared variables get their assignment type from the corresponding HDL statement. For instance, posedge operator 306 and equality operator 308 both produce intermediate values, and they are annotated with continuous assignments (assign type=CNT). In contrast, operators such as adder 304 and MUX 302 generate final (non-intermediate) values are respectively modeled as a blocking assignment (assign type=BA) and a nonblocking assignment (assign type=NBA).

The Verilog logic equality operator "==" is represented in the computation graph by using an equality operator "=" that is annotated as "logic equality" (equalType=LOGIC), to distinguish it from equality operators (annotated with equalType=CASE) that originate from Verilog case equality operators "===".

Figure 4:
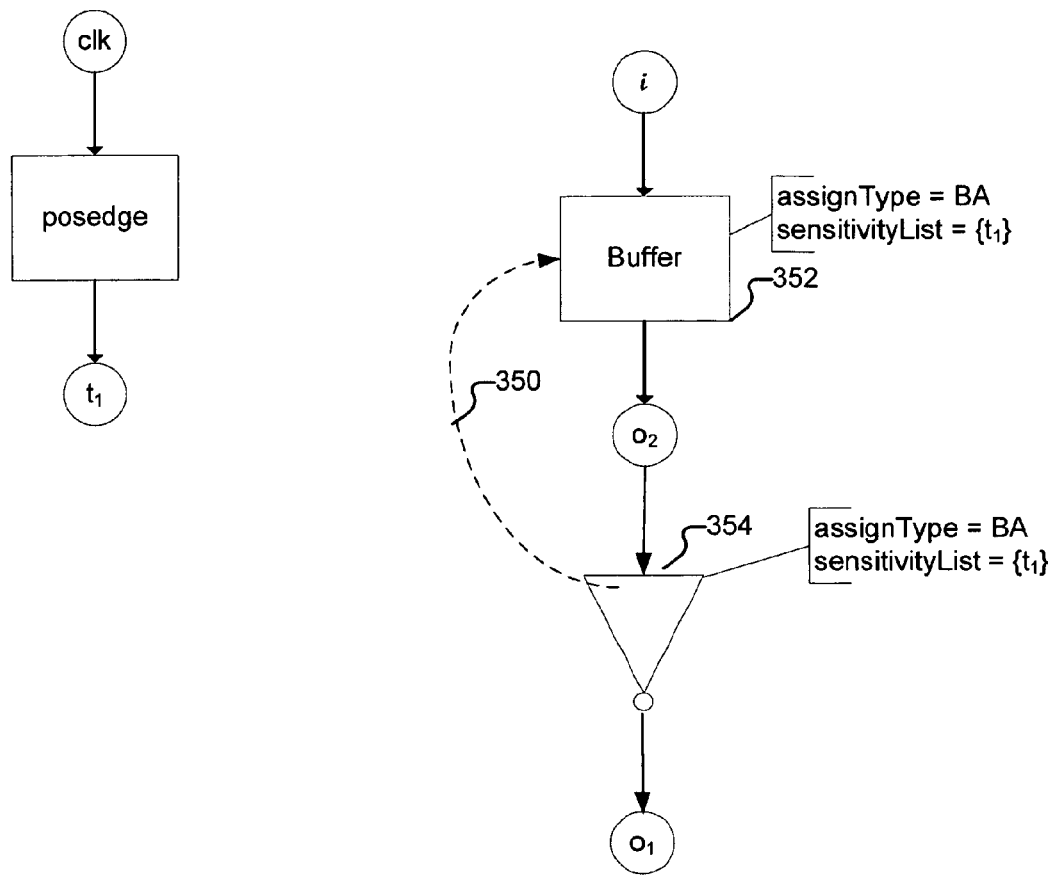
FIG. 4 is a computation graph illustrating an example module that requires precedence arcs.

FIG. 4 is a computation graph illustrating an example module that requires precedence arcs. The module is described in Verilog as follows:

```
module ex2 (clk, i, o1, o2);
    input wire clk, i;
    output reg o1, o2;
    always @(posedge clk)
    begin
        o1 = ~o2;
        o2 = i;
    end
endmodule
```

In the description above, a buffer operator 352 is added to model a variable-to-variable assignment. Because the assignment to o1 must be performed before the assignment to o2, in the computation graph this order is enforced with a precedence arc 350 between the NOT operator 354 and the buffer operator 352. Without the precedence arc, the data dependency from buffer 352 to NOT operator 354 would indicate opposite evaluation order (i.e., o2 is assigned first, then of is assigned) of what is expected.

Figure 5A:
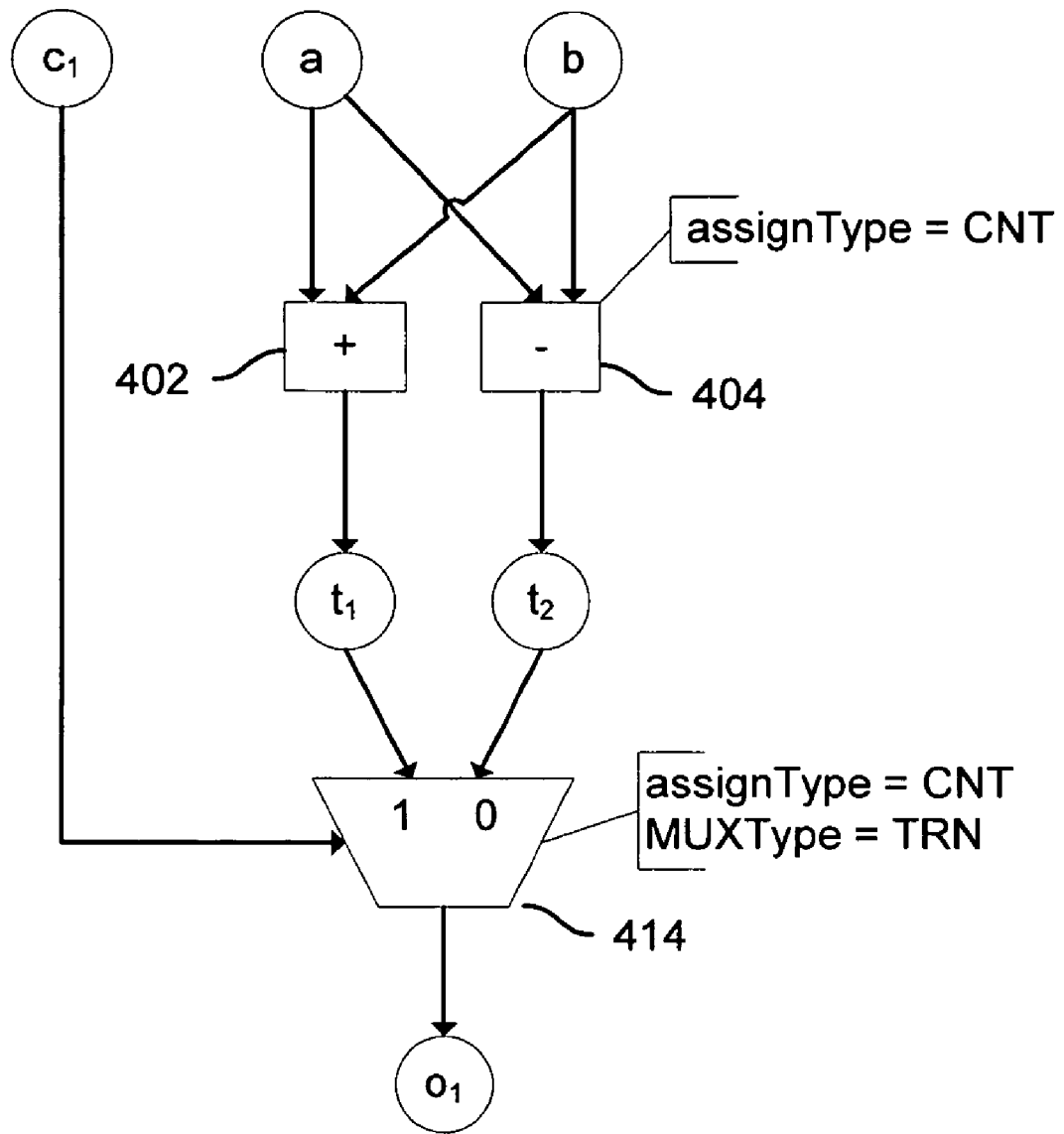
FIG. 5A and FIG. 5B are two parts of a computation graph illustrating an example module with two concurrent HDL statements.
Figure 5B:
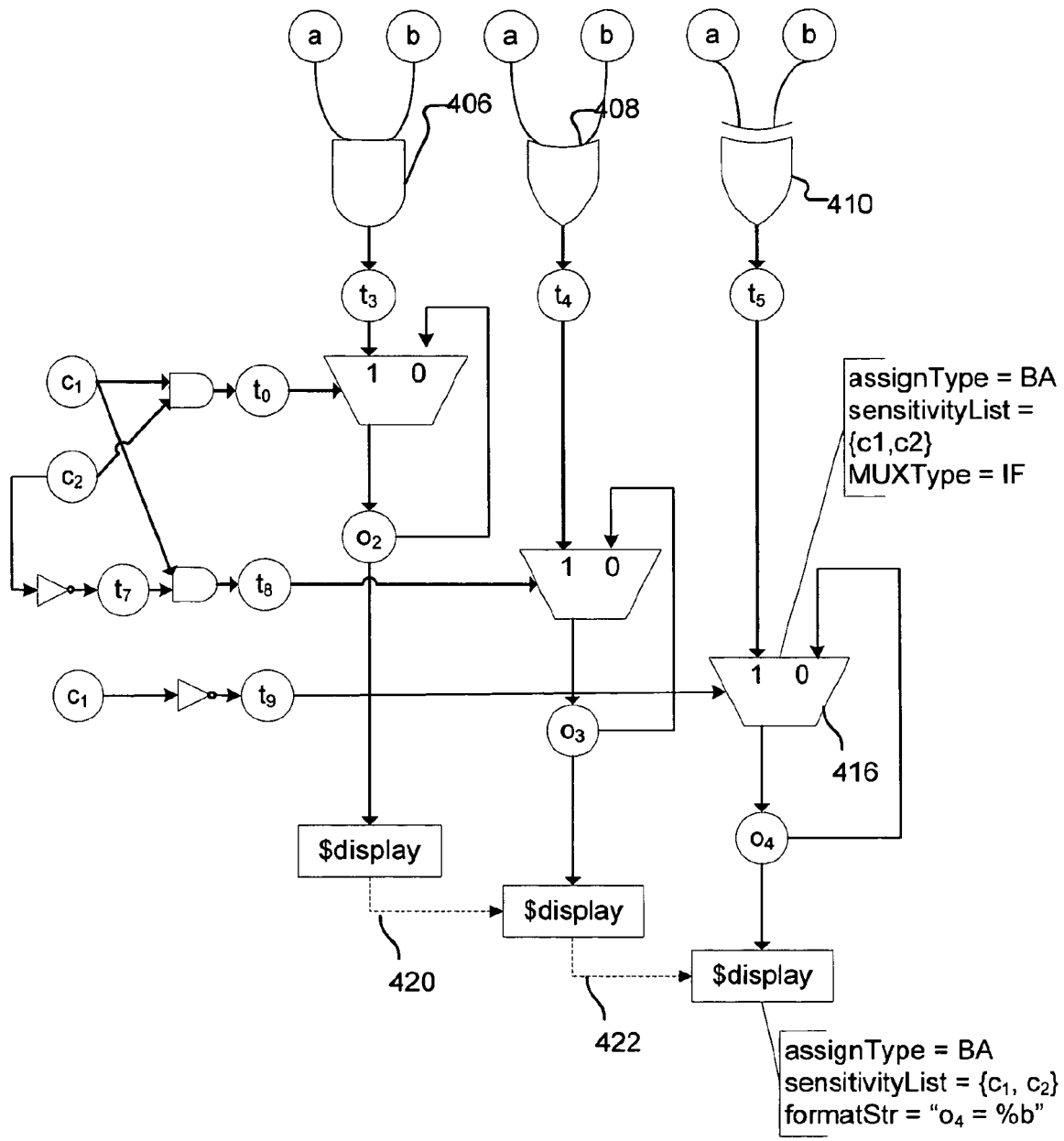

FIG. 5A and FIG. 5B are two parts of a computation graph illustrating an example module with two concurrent HDL statements. The module description is as follows

```
module ex3 (a, b, c1, c2, o1, o2, o3, o4);
    input wire a, b, c1, c2;
    output wire o1;
    output reg o2, o3, o4;
    assign o1 = c1 ? (a + b) : (a − b);
    always @(c1, c2)
    begin
        if (c1)
            if (c2)
                o2 = a & b;
            else
                o3 = a | b;
        else
            o4 = a ^ b;
        $display("o2=%b", o2);
        $display("o3=%b", o3);
        $display("o4=%b", o4);
    end
endmodule
```

In this example, the two concurrent Verilog statements (assign and always) are elaborated separately. FIG. 5A is the part of the computational graph resulting from the elaboration of the assign statement. FIG. 5B is the part of the computational graph resulting from the elaboration of the always statement, which includes nested statements that are, therefore, elaborated sequentially according to their sequential execution semantic. The sensitivity list of the always statement includes more than one variable.

Again, operators that output temporary variables, for example, add operator 402 and subtract operator 404 of FIG. 5A, AND operator 406, OR operator 408, and XOR operator 410 of FIG. 5B are modeled as continuous assignments. Operators that output user-defined variables take the assignment type and the sensitivity list from the corresponding HDL code. For example, MUX 416 of FIG. 5B has the assignment type of BA.

Further, different types of MUXes are used to represent different HDL expressions. For example, MUX 414 of FIG. 5A based on the assign statement is annotated as a ternary operator (MUXType=TRN) to distinguish from an if statement based MUX such as MUX 416 of FIG. 5B.

FIG. 5B uses the $display operator, which is an example of a behavioral operator that is not synthesizable. For certain Verilog constructs such as $display statements, a data-dependencies-driven evaluation order is not sufficient or adequate. Evaluation order must adhere to the ordering imposed by the original HDL code. Hence, precedence arcs such as 420 and 422 in FIG. 5B are included in the computation graph to model the evaluation order in the original HDL code. The precedence arcs guarantee that the attached operators are evaluated in the expected order and not just as soon as their operands have been evaluated. In the example shown, the precedence arcs guarantee that o2 is displayed prior to o3, which is displayed prior to o4. More generally, hardware description system calls and Program Language Interface (PLI) calls are handled in a similar way and HDL-precise execution order is enforced.

Figure 6A:
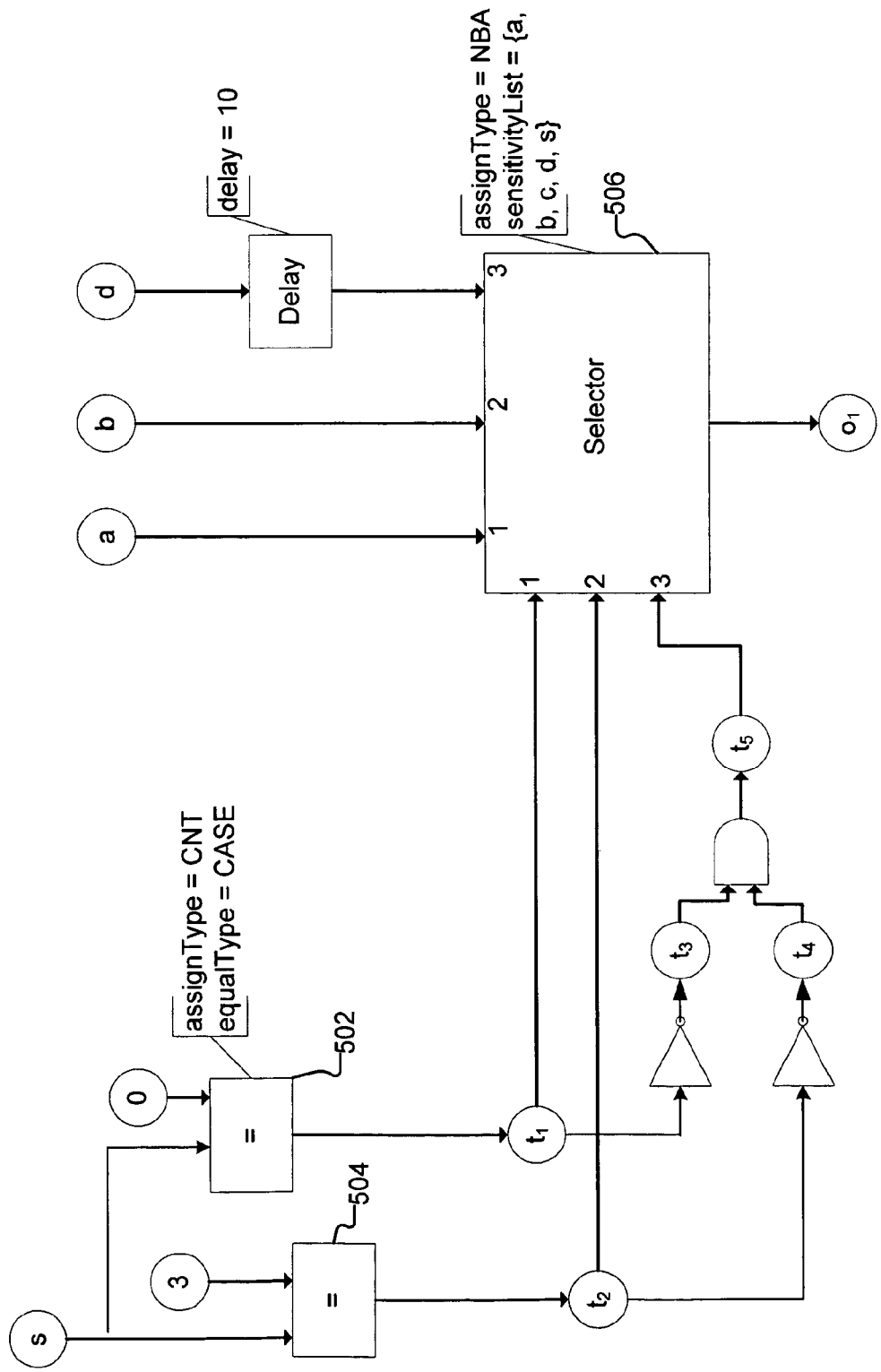
FIGS. 6A and 6B are two parts of a computation graph illustrating an example module that includes a case statement, a default sensitivity list, and delay operators.
Figure 6B:
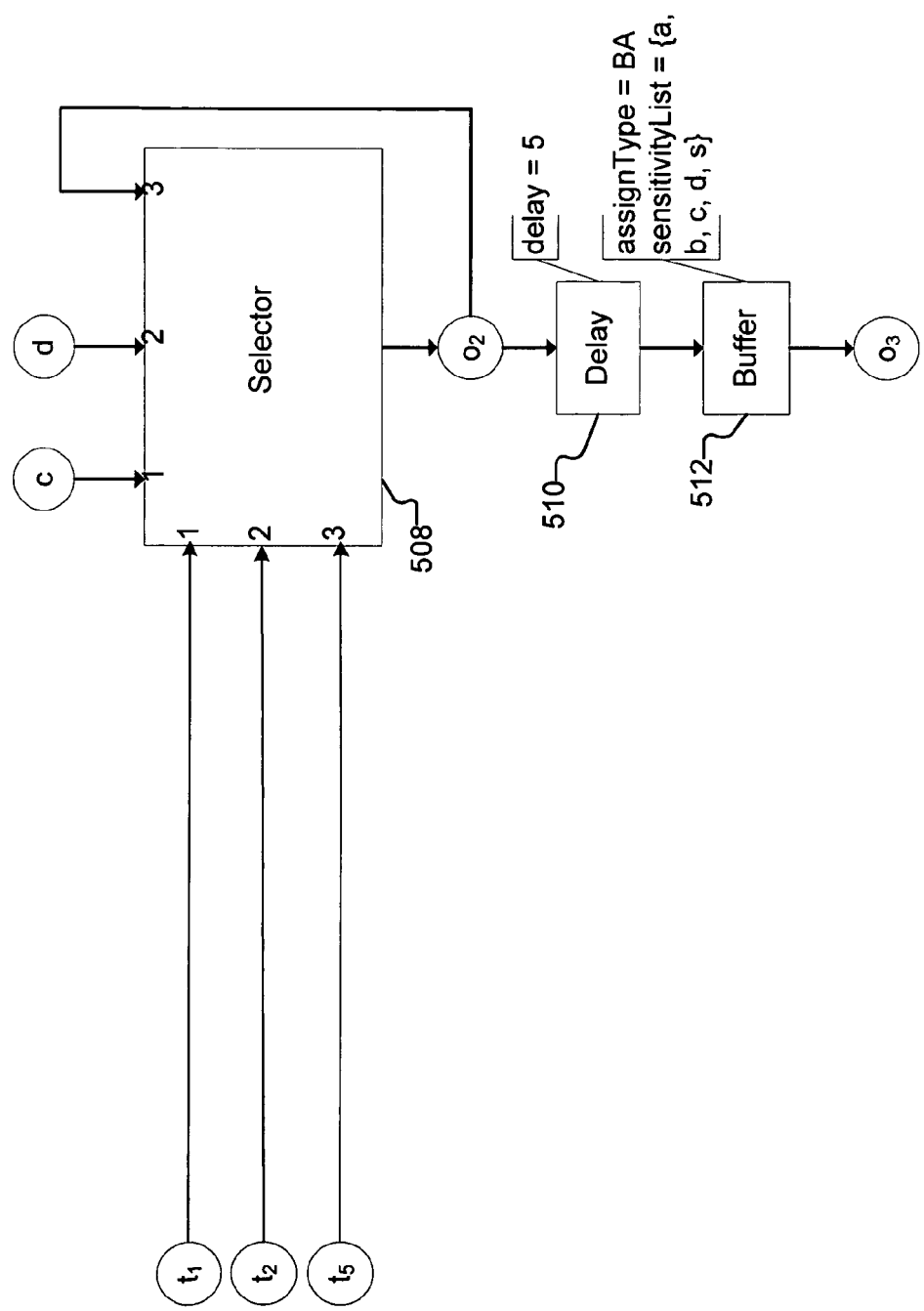

FIGS. 6A and 6B are two parts of a computation graph illustrating an example module that includes a case statement, a default sensitivity list, and delay operators. The module description is as follows:

```
module ex4 (s, a, b, c, d, o1, o2, o3);
    input wire a, b, c, d;
    output reg o1, o2, o3;
    always @(*)
    begin
        case (s)
            2'b00: begin
                o1 <= a;
                o2 <= c;
            end
            2'b11: begin
                o1 <= b;
                o2 <= d;
            end
            default:
                o1 <= #10 d;
        endcase
        o3 = #5 o2;
    end
endmodule
```

In the computation graph shown, equality operators such as 502 and 504 have equality type of "case equality".

Default sensitivity list (*) is resolved and operators are annotated accordingly. According to the Verilog standard, a default sensitivity list is resolved as the set of right hand side (RHS) variables in the considered statement: a, b, c, d, s.

Selector operators 506 of FIGS. 6A and 508 of FIG. 6B have N conditions and N inputs. The output is assigned to the first input for which the associated condition is true. In the example shown N=3.

Delay operators are directly connected to the inputs of other operators, without intermediate variables. When a delay operator is connected to the input of a conditional operator such as a selector operator, together they indicate that the assignment corresponding to that input should use the current value fed to the delay operator but should be performed at some specified future time. For instance, referring to FIG. 6A, if t5 is true, then variable d is sampled and the sampled value is assigned to variable o1 at 10 simulation time units in the future.

In some embodiments the delay time units are specified as an attribute of the delay operator. In some embodiments the delay time units are specified as another input to the delay operator.

An unconditional HDL assignment with a delay operator is elaborated with a buffer. For example, in FIG. 6B, a delay operator 510 and a buffer 512 are used for the assignment of o3.

Figure 7:
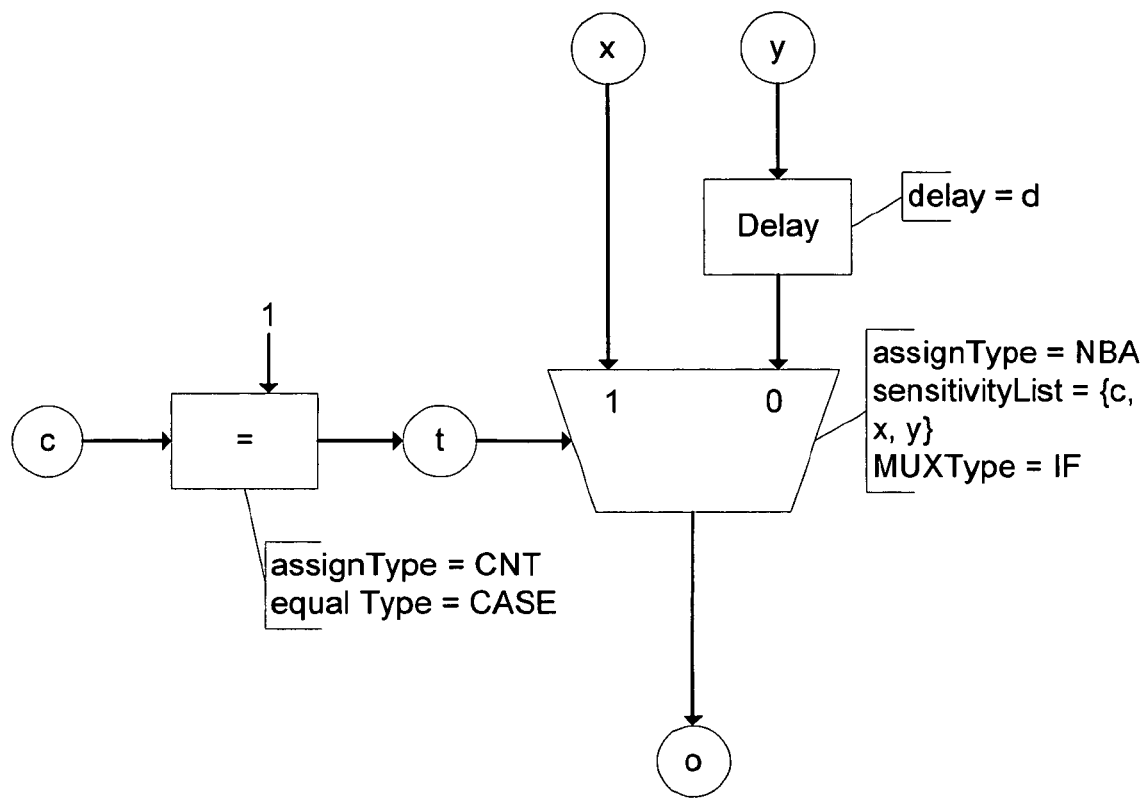
FIG. 7 is a computation graph illustrating the use of a delay operator with a different conditional HDL statement.

FIG. 7 is a computation graph illustrating the use of a delay operator with a different conditional HDL statement. The module description is as follows:

```
module ex5 (c, x, y, d, o);
    input wire c, x, y;
    input integer d;
    output reg o;
    always @(c, x, y) begin
        if (c)
            o <= x;
        else
            o <= #d y;
    end
endmodule
```

In the computation graph, if c is equal to '1', then x is immediately assigned to o; otherwise, the current value of y is assigned to o but the assignment is performed in the future, as determined by the current value of variable d.

Figure 8:
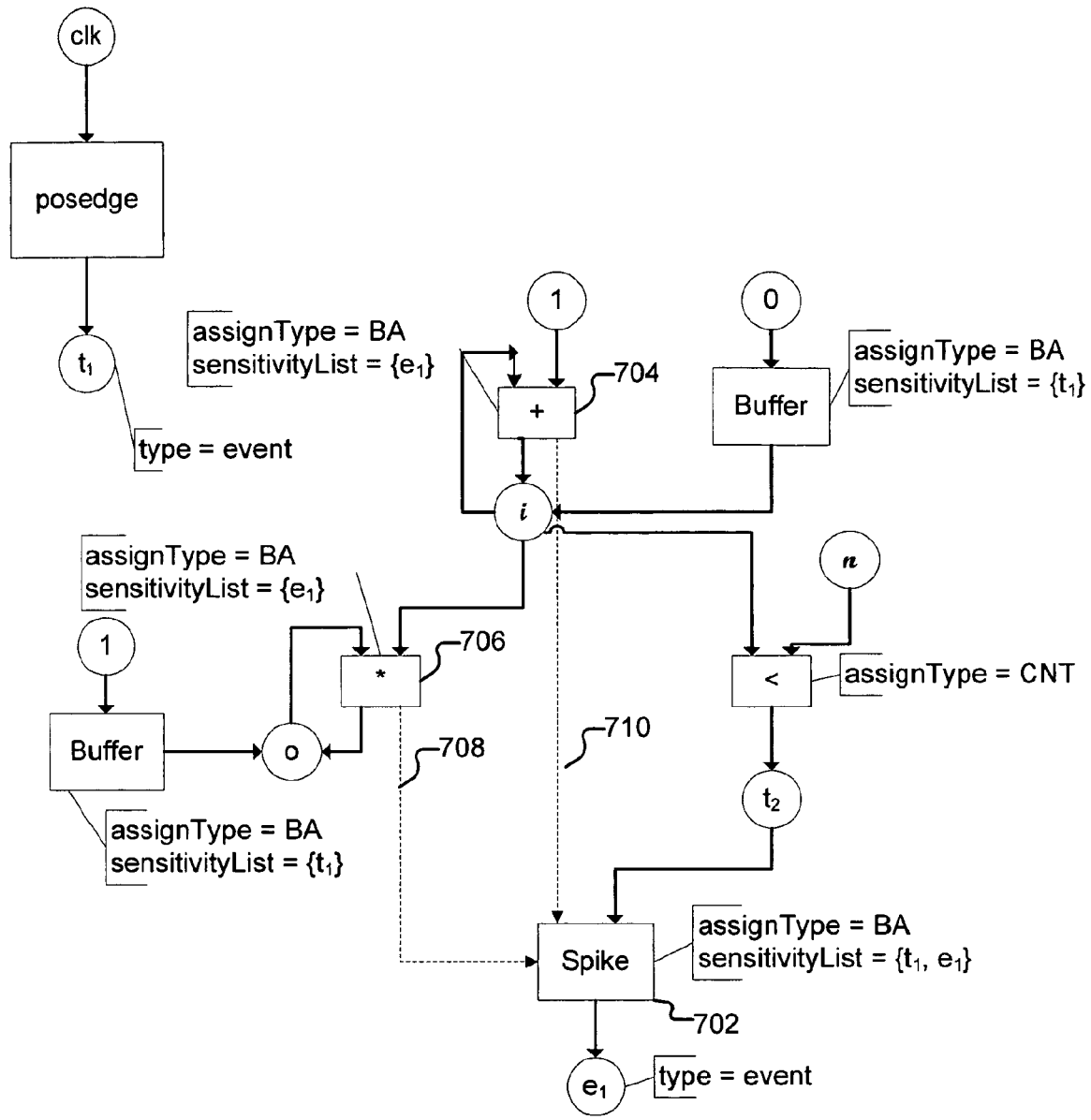
FIG. 8 is a computation graph illustrating an example module that includes a while loop with unbounded exit condition.

FIG. 8 is a computation graph illustrating an example module that includes a while loop with unbounded exit condition. In other words, the exit condition of the while loop is not determined at compile time; instead, it is dependent on runtime conditions. The module description is as follows:

```
module ex6 (clk, n, o);
    input wire clk;
    input integer n;
    output integer o;
    always @(posedge(clk))
    begin
        o = 1;
        i = 0;
        while (i < n)
            begin
                o = o * i;
                i = i + 1;
            end
    end
endmodule
```

In this example an event variable e1 is introduced. Event variables can be 0 or 1 and are handled in a special way when they appear in a sensitivity list. Specifically, an operator sensitive to an event variable will only be sensitive to the 0-to-1 transitions of the event variable. This is in contrast with the more common case where an operator is sensitive to any change of the variables in its sensitivity list. In this example, e1 is used to indicate the event of detecting that i is less than n.

A "spike" operator 702 that is sensitive to both t1 and e1 is also introduced. In other words, "spike" responds to both the positive edge of signal t1 and positive transition in event e1. The operator has an input t2, which corresponds to the result of the comparison i<n. The spike operator performs the following operations: e1=0 and e1=t2 in such a way that a positive spike appears on the output e1 when the input t2 is true. Operators generated from the elaboration of the loop body (e.g., adder 704 and multiplier 706) are sensitive to e1 and not t1. The spike operator is sensitive to both t1 and e1 and initiates the loop on t1's positive transition. The loop continues to operate as long as e1 continues to have a spike (thus indicating that i<n is true). The loop exits when e1 no longer has a spike (thus indicating that i<n is no longer true).

Precedence arcs such as 708 and 710 are included to guarantee that in the iterations following the first one, the spike operator is evaluated after the multiplier and the adder.

Another behavioral characteristic encoded in the computation graph is the N-valued logic behavior of the modeled HDL variables. For example, Verilog variables typically can take one of 4 possible logic values (0, 1, X, Z), where X represents unknown, and Z represents high impedance or open circuit. Sometimes, Verilog logic variables also have an associated strength information that indicates the intensity of the taken logic value (e.g., supply drive, strong drive, weak drive). Other logic value representation schemes can be used as well, for example VHDL defines a 9-valued logic that represent different signal values. These types of logic value schemes are collectively referred to as N-valued logic (where N>2). For purposes of illustration, the following discussion uses Verilog's 4-valued logic as an example although other N-valued logic may be similarly handled.

To run simulation code on a processor that executes binary instructions and data requires the simulation code to be binary. Thus, in some embodiments, generating code from the data flow representation includes encoding the data flow representation to generate a Boolean representation that uses logic values of 0 and 1 only. In example system 200, algebraizer 212 encodes the computation graph representation, which is expressed in terms of N-valued HDL variables, into a Boolean representation. Referring to the 2-bit counter example discussed above, suppose that 4-valued logic is used in the HDL description, then a 4-valued scalar variable such as the clock clk can be expressed using three Boolean variables clk, clk', clk" according to the following truth table:

TABLE 1

| clk | clk | clk' | clk" |
|---|---|---|---|
| 0 | 0 | 0 | 0 |
| 1 | 1 | 0 | 0 |
| X | don't care | 1 | 0 |
| Z | don't care | 0 | 1 |

Other HDL variables can be similarly encoded. Scalar signal tc can be encoded using Boolean variables tc, tc', and tc". Vector signal value can be encoded using Boolean variables value[0], value[0]', value[0]", value[1], value[1]', and value[1]".

In some embodiments, a scalar variable such as the clock clk is expressed using only two Boolean variables clk, and clk' according to the following truth table:

TABLE 2

| clk | clk | clk' |
|---|---|---|
| 0 | 0 | 0 |
| 1 | 0 | 1 |
| X | 1 | 0 |
| Z | 1 | 1 |

The N-valued operations modeled in the computation graph are converted in the Boolean representation as operations for the encoded Boolean variables. The conversion is derived based on the truth tables of the operations and of the used variable encoding. For example, a Verilog AND operation (&&) performed on two 4-valued Verilog variables a and b results in the following truth table for the Verilog expression "o=a && b":

TABLE 3

| a | b | o |
|---|---|---|
| 0 | 0 | 0 |
| 0 | 1 | 0 |
| 0 | X | 0 |
| 0 | Z | 0 |
| 1 | 0 | 0 |
| 1 | 1 | 1 |
| 1 | X | X |
| 1 | Z | X |
| X | 0 | 0 |
| X | 1 | X |
| X | X | X |
| X | Z | X |
| Z | 0 | 0 |
| Z | 1 | X |
| Z | X | X |
| Z | Z | X |

Assuming that 4-valued Verilog variables a, b, and o are encoded in Boolean representation using Boolean variables (a, a', a"), (b, b', b") and (o, o', o"), respectively, according to Table 3, the Boolean representation generated from the AND operator in the computation graph resulting from Verilog expression "o=a&&b" is:

o=a AND b o'=(a OR a' OR a") AND (b' OR b") OR (a' OR a")
    AND b o"=0

The Boolean representations can be similarly derived for other type of operations in the computation graph. For instance, the posedge operator in the computation graph of the two-bit counter module previously described has the following Boolean representation, where Boolean variables clk, clk', and clk" encode the current value of signal clk and variables pclk, pclk', pclk" encode the previous value of the signal o=(NOT (pclk OR pclk' OR pclk")) AND (clk OR clk'
    OR clk") OR (pclk' OR pclk") AND clk AND
    (NOT (clk' OR clk"))

o'=0 o"=0 pclk=clk;

pclk'=clk' pclk"=clk"

Code generator 216 in FIG. 2 generates machine code that can be used to concurrently simulate the hardware design under multiple scenarios. In some embodiments, this is done by compiling the Boolean representation 214 in FIG. 2 into a number of software subroutines that efficiently perform, with a single invocation, a given computation for N different simulation scenarios. Processing the original hardware design 202 into a Boolean representation facilitates concurrent processing of N independent simulations of the design because logic operations in the Boolean representation can be directly compiled into bitwise logic instructions. For example, logic operations such as AND, OR, and NOT can be compiled into x86 SIMD instructions PAND, POR, and PNOT, respectively, which perform bitwise logic operations on 128-bit words. Likewise, arithmetic operations in the Boolean representation can be either converted into a sequence of logic operations and, thence, compiled into bitwise logic instructions, or can be more directly compiled into SIMD arithmetic instructions such as the x86 instructions PADDD and PSUBD, which perform arithmetic addition and subtraction on 4 adjacent words of 32 bits each. Because of the limitations of the available instructions on the computing system on which concurrent simulation is executed, it may not be always possible to compile a given operation in the Boolean representation into a single machine instruction and, therefore, a more complex set of machine instructions may be generated. (For instance, when the number of concurrent simulations N is larger than the maximum parallelism offered by the available SIMD instructions.)

Figure 9:
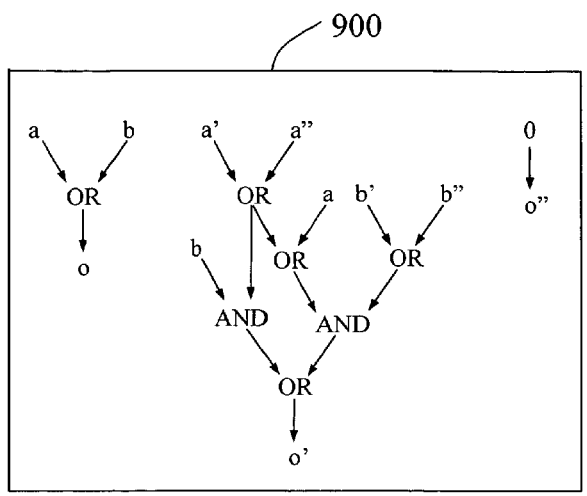
FIG. 9 is a diagram illustrating the operations of an embodiment of a code generator for the example of a Verilog expression "o=a && b".
Figure 9:
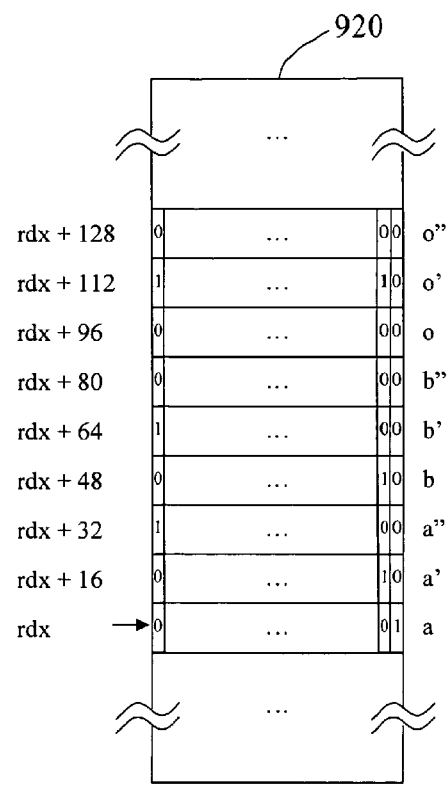

FIG. 9 is a diagram illustrating the operations of an embodiment of a code generator for the example of a Verilog expression "o=a && b" discussed above. The example assumes that concurrent simulation is performed on a computing system supporting x86 SIMD operations; the number of concurrent simulations, N, is equal to 128; and Table 1 is used for the encoding of Verilog variables into Boolean variables. Once the Boolean representation has been generated, the code generator builds a directed graph 900 that factors out redundant computation by sharing the results from common operations. According to directed graph 900, the result of the logic OR of Boolean variables a' and a" is reused. The code generator compiles directed graph 900 into a machine code subroutine 910. Lines 1-3 in machine code 910 compute the value of Boolean variable o; lines 4-13 in machine code 910 compute the value of Boolean variable o'; lines 14-15 in machine code 910 compute the value of Boolean variable o".

Memory layout 920 shows how the code generator allocates Boolean variables in the memory of the computing system on which concurrent simulation is executed. The example assumes that x86 register RDX is used to index the memory region where Boolean variables are allocated. Each Boolean variable is allocated in a memory word of 128-bits. The i-th bit of each memory word is used to express the value of the Boolean variable in the i-th concurrent simulation of the hardware design. According to memory layout 920, the content of the 128-bit words associated with Boolean variables a, a', and a" are <0 ... 01>, <0 ... 10>, <1 ... 00>, respectively. In the first simulation, the least significant bits of the words correspond to a=1, a'=0, a"=0; hence, Verilog variable a corresponds to '1'; in the second simulation, a=0, a'=1, and a"=0; hence, Verilog variable a is 'X'; in the N-th simulation, the most significant bits of the words correspond to a=0, a'=0, a"=1; hence, Verilog variable a is 'Z'. Likewise, according to memory layout 920, the content of the 128-bit words associated with Boolean variables b, b', and b" are <0 ... 10>, <1 ... 00>, <0 ... 00>, respectively, which is interpreted as follows: in the first simulation, the least significant bits of the words correspond to b=0, b'=0, b"=0; hence, Verilog variable b is '0'; in the second simulation b=1, b'=0, and b"=0 and, hence, Verilog variable b is '1'; in the N-th simulation b=0, b'=1, b"=0 and, hence, Verilog variable b is '0'. By using this technique, N (in this case, 128) simulations can be carried out concurrently, improving performance over existing non-concurrent simulation techniques in which only the last few bits of each memory word are used to store a Verilog variable value and the rest are unused.

Figure 10:
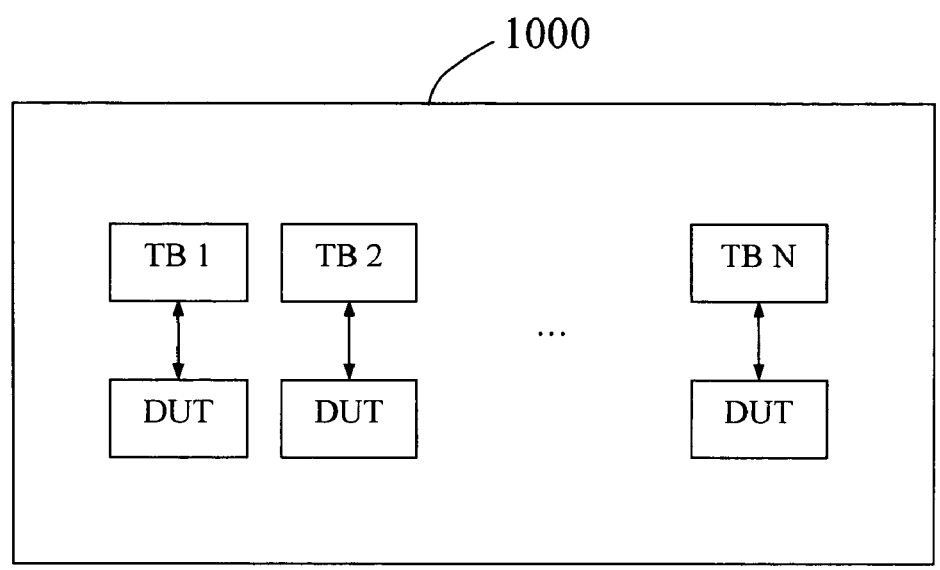
FIG. 10 is a diagram illustrating example scenarios where N different tests are provided for a hardware design.
Figure 10:
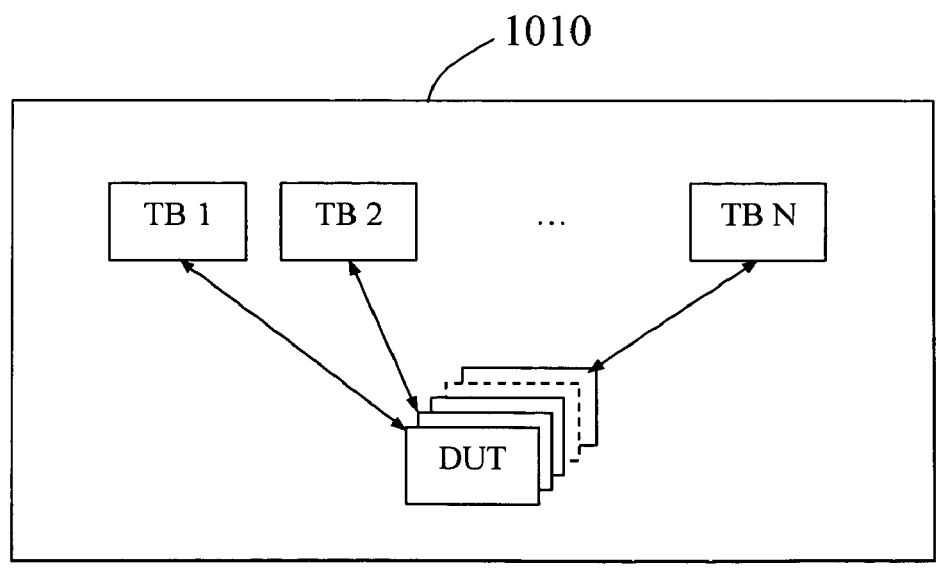

In some embodiments, the concurrent simulation is used to simulate a given design under multiple test conditions. FIG. 10 is a diagram illustrating example scenarios where N different tests are provided for a hardware design. In this example, each test comprises a Design Under Test (DUT) component that includes the HDL code of the considered hardware design, and a Test Bench (TB) component that includes HDL code that drives the hardware design under specific test conditions. The tests differ only in their test bench components since they all target the same hardware design. A typical approach to perform the simulations depicted in scenario 1000 is to launch the N tests in sequence on a single simulation system. Another standard approach is to dispatch the tests on multiple simulation systems and run them in parallel. In scenario 1010, in contrast, all N tests are performed concurrently on a single simulation system that employs the concurrent simulation technique discussed above to perform multiple DUT simulations at the same time. In scenario 1010, the HDL variables of the DUT component are encoded as Boolean variables and are allocated on N-bit memory words of the simulation system such that the i-th bit of a word indicates the value of the associated Boolean variable (and, hence, of the associated HDL variable) in the i-th concurrent simulation. An interface logic in the concurrent simulation system maps the values of the interface signals between the TB components and the DUT, where the i-th simulation of the DUT will be applied to the stimuli generated by the i-th TB component and, likewise, the i-th TB component will be subject to the output response from the i-th simulation of the DUT component.

Figure 11:
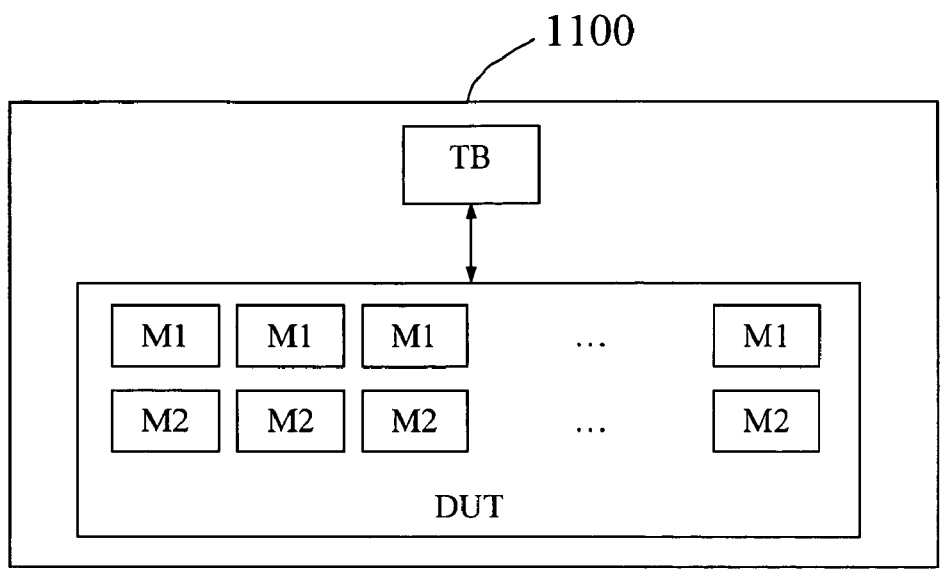
FIG. 11 is a block diagram illustrating an example scenario in which a single test is applied to a hardware design with duplicated modules.
Figure 11:
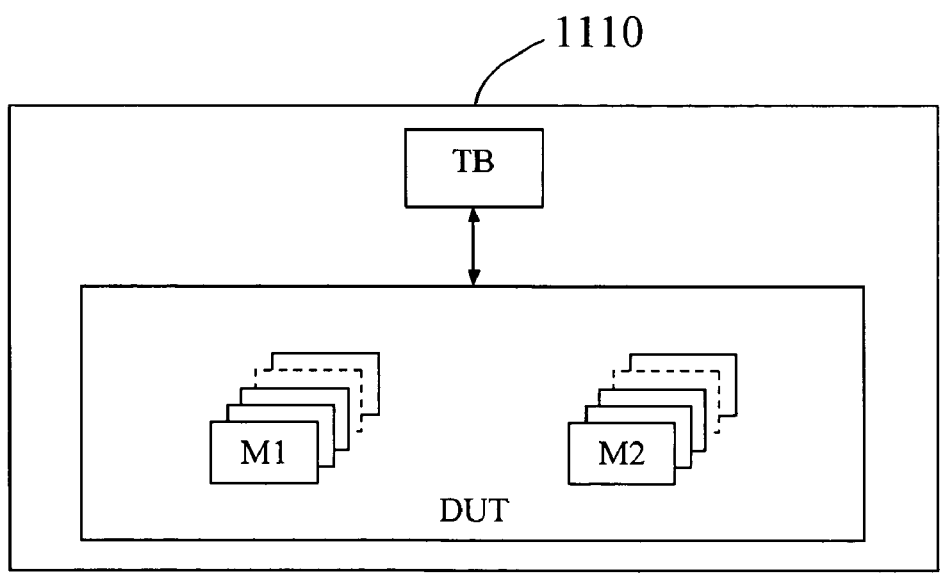

In some embodiments, the concurrent simulation technique discussed above is used to perform a single logic simulation of a design that has a high-degree of internal replication. Examples of such designs include multi-core processors, graphic processors, network processors, memories, or other circuits with many replicated modules. FIG. 11 is a block diagram illustrating an example scenario in which a single test is applied to a hardware design. Similarly to the example discussed above, the test comprises a Test Bench (TB) component and a Design Under Test (DUT) component. In scenario 1100 the DUT component includes two HDL modules M1 and M2, each module being duplicated N times. The module instances may be connected to the other parts of the DUT component in various ways and, in general, will be subjected to different stimuli. A standard approach to perform the simulation depicted in scenario 1100 is to consider the multiple module instantiations as separate entities and simulate them separately. In scenario 1110, in contrast, a simulation system that employs the concurrent simulation technique discussed above is used to perform the N simulations of the N instances of module M1 as a single concurrent simulation of module M1, and likewise for module M2. The simulation system in scenario 1110 includes an interface logic that maps the input/output signals of module M1 in the i-th concurrent simulation of M1 to the DUT components in scenario 1110 that are connected to the i-th instance of module M1 in scenario 1100.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of simulating hardware, including:
using a processor, generating a data flow representation of the hardware, based on a hardware description language (HDL) description, the data flow representation including a computation graph, which includes compatibility information that preserves behavioral and synthesizable characteristics of the HDL description during simulation;
generating code from the data flow representation; and
executing the code concurrently.

2. The method of claim 1, wherein executing the code concurrently includes concurrently simulating the hardware under a plurality of operating scenarios.

3. The method of claim 1, wherein executing the code concurrently includes concurrently simulating the hardware under a plurality of test conditions.

4. The method of claim 1, wherein the hardware includes a plurality of duplicated modules, and executing the code concurrently includes performing a concurrent simulation on the plurality of duplicated modules.

5. The method of claim 1, wherein the compatibility information includes information to preserve control flow.

6. The method of claim 1, wherein the compatibility information includes information to preserve timing and a hardware description of scheduling semantic information.

7. The method of claim 1, wherein the compatibility information includes information for modeling a hardware description of system call.

8. The method of claim 1, wherein the compatibility information includes information for modeling interaction with an external software module.

9. The method of claim 1, wherein the compatibility information includes information pertaining to the possible values of a hardware description of a variable.

10. The method of claim 9, wherein the hardware description of the variable includes four possible logical states.

11. The method of claim 9, wherein the hardware description of the variable has a logical state and a signal strength level.

12. The method of claim 1, wherein the compatibility information includes an operator.

13. The method of claim 1, wherein the compatibility information includes an operator, and the operator has an attribute.

14. The method of claim 1, wherein the compatibility information includes an assignment type.

15. The method of claim 1, wherein the compatibility information includes a sensitivity list.

16. The method of claim 1, wherein the compatibility information includes a precedence arc.

17. The method of claim 1, wherein the compatibility information includes a posedge operator.

18. The method of claim 1, wherein the compatibility information includes a delay operator.

19. The method of claim 1, wherein the compatibility information includes a spike operator.

20. The method of claim 1, wherein generating the code includes generating a Boolean representation from the data flow representation and generating the code based on the Boolean representation.

21. The method of claim 20, wherein a multi-valued HDL variable in the data flow representation is converted into a plurality of Boolean variables in the Boolean representation.

22. The method of claim 20, wherein an operator in the data flow representation is converted into an operation on Boolean variables in the Boolean representation.

23. The method of claim 1, wherein the code that is generated based on the data flow representation includes a bitwise instruction.

24. The method of claim 1, wherein the code that is generated based on the data flow representation includes a Single Instruction Multiple Data (SIMD) instruction.

25. A hardware simulation system, comprising:
a processor configured to:
generate a data flow representation of the hardware, based on a hardware description language (HDL) description, the data flow representation including a computation graph, which includes compatibility information that preserves behavioral and synthesizable characteristics of the HDL description during simulation;
generate code from the data flow representation; and
execute the code concurrently; and
a memory coupled to the processor and configured to provide the processor with instructions.

26. A computer program product for simulating hardware, the computer program product being embodied in a non-transitory computer readable storage medium and comprising computer instructions for:

generating a data flow representation of the hardware, based on a hardware description language (HDL) description, the data flow representation describing a flow of data through various components of the hardware, the data flow representation including compatibility information that preserves behavioral and synthesizable characteristics of the HDL description during simulation;
generating code from the data flow representation; and
executing the code concurrently.

* * * * *